United States Patent [19]  
Lipp

[11] 4,165,642  
[45] Aug. 28, 1979

[54] MONOLITHIC CMOS DIGITAL TEMPERATURE MEASUREMENT CIRCUIT

[76] Inventor: Robert J. Lipp, 15881 Rose Ave., Los Gatos, Calif. 95030

[21] Appl. No.: 889,492

[22] Filed: Mar. 22, 1978

[51] Int. Cl.² ............................................. G01K 7/00
[52] U.S. Cl. ................................................ 73/362 SC
[58] Field of Search ................... 73/362 SC; 307/117; 328/3; 357/25; 323/22 T

[56] References Cited  
U.S. PATENT DOCUMENTS

| | | | |
|---|---|---|---|
| 3,809,929 | 5/1974 | Vittoz | 73/362 SC |
| 3,873,857 | 3/1975 | Farrish | 73/362 SC |
| 4,085,359 | 4/1978 | Ahmed | 323/22 T |

Primary Examiner—S. Clement Swisher  
Attorney, Agent, or Firm—Owen, Wickersham & Erickson

[57] ABSTRACT

A monolithic integrated complementary metal oxide semiconductor (CMOS) circuit senses internal junction temperature and converts it to a binary coded decimal output signal. The circuit compares a temperature dependent junction voltage with a bandgap reference voltage controlled by a very stable amplifier. The comparison differential is then converted to a binary coded decimal output signal by an analog to digital converter. The circuit utilizes parasitic bipolar NPN transistor elements formed from a substrate of the chip in a conventional CMOS fabrication process. The principles of the present invention are also broadly applicable to other semiconductor technologies such as integrated injection logic (I²L).

15 Claims, 4 Drawing Figures

MONOLITHIC CMOS DIGITAL TEMPERATURE MEASUREMENT CIRCUIT

BACKGROUND OF THE INVENTION

The present invention relates to electronic temperature measurement circuits. More particularly, the present invention relates to a monolithic integrated CMOS circuit for sensing temperature and for providing a binary coded decimal output signal.

Prior techniques for temperature measurement and conversion thereof to digital data required a considerable number of separate parts and interconnected components with concomitant power consumption.

For monitoring applications which require long term accuracy and stability, the specification and use of high precision components with careful part testing, screening and selection of the components was required. The drawbacks of those techniques included the bulk of the resultant circuitry, the time and expense required for manufacture, power supply requirements and dissipation which usually required connection to a primary power source and did not readily provide for self-contained battery operation at low current drain.

While it has been proposed to utilize bipolar bandgap voltage reference circuits in thermometer applications (application note AN-18 entitled "Thermometer Applications of the REF-02," published by Precision Monolithics Inc. in 1976), the use of such techniques in low power consumption CMOS circuitry has not heretofore been thought to be practical.

SUMMARY OF THE INVENTION

One object of the present invention is to provide a temperature measurement circuit having a digital output which is fully self-contained within a single monolithic integrated circuit chip.

Another object of the present invention is to provide a low power consumption fully integrated temperature measurement circuit which is suited to continuous operation at very low power consumption levels.

A further object of the present invention is to utilize standard CMOS integrated circuit fabrication techniques to provide a monolithic temperature measurement circuit which utilizes parasitic bipolar transistors formed from the substrate of the CMOS integrated circuit chip.

A still further object of the present invention is to provide an integrated circuit for producing an on-chip bandgap reference voltage which is substantially independent of variation resulting from the chip fabrication process.

Yet another object of the present invention is to utilize a comparison of a temperature dependent junction voltage with a bandgap reference voltage within a single integrated circuit chip to provide a differential voltage which is directly convertible to a digital temperature signal.

These and other objects and advantages are accomplished by a single, low power monolithic silicon chip carrying an integrated circuit for continuously sensing temperature phenomena and for providing a digital output corresponding to the sensed temperature. The circuit includes a temperature sensor for providing an output voltage which varies with the temperature at the region of the sensor transistor and which is substantially process independent. A bandgap voltage reference circuit in the chip provides a reference voltage which is very stable and substantially independent of the temperature of the chip and voltages present thereat. An analog to digital converter in the chip compares the output voltage of the temperature sensor with the reference voltage and derives a digital output corresponding to the sensed temperature. The circuit may be formed by a CMOS chip fabrication process wherein the on-chip temperature sensor circuit advantageously utilizes parasitic NPN transistors formed from the substrate of the CMOS chip, with the transistors configured as emitter followers.

The bandgap voltage reference circuit may include a first emitter follower NPN transistor, and a second transistor parallel connected with the first. A balancing amplifier having one input connected to the emitter of the first transistor and another input connected to the emitter of the second transistor provides an output connected to the base of the second transistor to cause the emitter voltages of both transistors to track, with a reference voltage being provided at the base of the second transistor.

The circuit may also include an automatic null circuit connected to zero the offsets of the input of the balancing amplifier of the bandgap reference voltage circuit. The null circuit may include an input floating and switching array connected to the inputs of the balancing amplifier for temporarily disconnecting one of the inputs and connecting the other to both inputs. A voltage charging network connected to the substrate of one of the input transistors adjusts the substrate voltage during an auto-zero cycle and thereby the threshold voltage of the input transistor and the balancing amplifier. A comparator connected to the input transistors' drains in the balancing amplifiers senses when the charging network causes the input transistors to reach the null point of the balancing amplifier and thereupon signals a control circuit to terminate the calibrating cycle after a predetermined number of null point crossings, eliminating random noise effects. The control circuit thereafter reconnects the inputs of the balancing amplifier to the reference transistors so that constant reference voltages may be provided by the bandgap voltage reference circuit to the analog to digital converter for use in comparison with the temperature sensor in the conversion to digital information of the temperature signal.

Other objects, advantages and features of the invention will become apparent from the following detailed description of a preferred embodiment presented with the accompanying drawings.

DETAILED DESCRIPTION OF A PREFERRED EMBODIMENT

Figure 1:
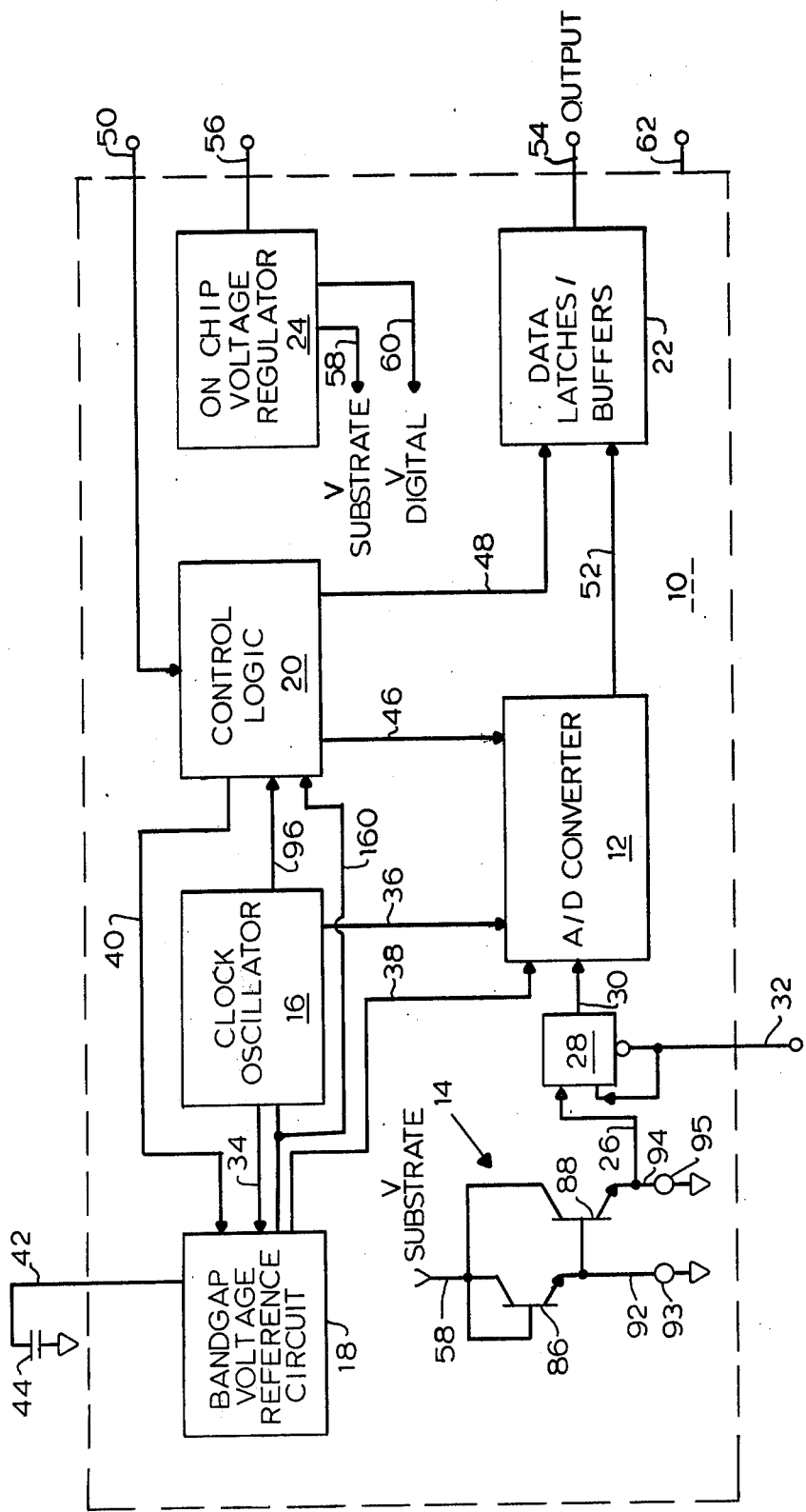
FIG. 1 is a block and schematic diagram of certain elements of a monolithic integrated circuit for sensing temperature and providing a digital output.

A CMOS digital temperature measurement circuit 10, shown in FIG. 1, is formed as a monolithic integrated circuit by a standard metal gate CMOS process. The circuit elements on the chip 10 appear within the rectangle defined by the broken lines, and various external connections to the chip are shown extending beyond the dashed line rectangle.

As shown in FIG. 1, the circuit 10 includes the following functional elements: an analog-to-digital converter 12, a temperature sensor 14, a clock oscillator 16, a bandgap voltage reference circuit 18, control logic circuitry 20, data latches and output buffer circuitry 22, and on-chip voltage regulators 24.

The signal interconnections between these circuits are generally shown in FIG. 1. The temperature sensor 14 is connected by a line 26, a switch 28, and another line 30 to an input of the A to D converter 12. An external line 32 enables temperature data from an external sensor to be processed by the circuit 10. The clock oscillator 16 provides clocking pulses to the A to D converter 12 via a line 36, and also to the bandgap voltage reference circuit 18 through a connection 34. The bandgap voltage reference circuit 18 has an output line 38 connected to the A to D converter 12, and is connected to the control logic 20 via a connection 40. A line 42 extends from the reference circuit 18 to an external capacitor 44. The control logic 20 is connected to the A to D converter 12 via a line 46 and to the data latches and buffers 22 through a connection 48. A line 50 enables external control signals to be applied to the control logic 20. A digitized data output line 52 from the A to D converter 12 is connected to the data laches and output buffers circuit 22, and an output line 54 therefrom provides an output from the circuit 10. Supply voltage is provided to the circuit 10 through a connection 56 to the on board voltage regulator 24 which supplies analog element voltages via an analog supply bus 58 and digital element voltages via a digital supply bus 60 which extend throughout the chip 10. A substrate connection 62 completes the DC supply path of the circuit 10.

An analog to digital converter 12 functions to convert analog temperature data into digital values. The actual circuitry used in the analog to digital converter 12 is not critical, and any A to D circuit suitable to CMOS integration is acceptable. Such circuits and techniques include pulse width modulation, dual slope, charge balancing, successive approximation, counter ramp methods and also delta-sigma modulation encoders.

A modified delta-sigma modulation encoder is preferred in this case because it is easier to integrate in CMOS, and because of its good accuracy without need for high precision components nor long term oscillator stability. A thorough presentation of delta modulation systems, which were first developed in 1946, is to be found in a book by Raymond Steele entitled *Delta Modulation Systems,* published by Halstead Press division of John Wiley & Sons, Inc., New York, © 1975 (particularly pages 17–20).

A delta-sigma encoder is free running, and the output is a pulse encoding of the analog input and has an average DC value equal to the analog input. Because of this linear relationship, the positive pulses can be accumulated over a period of time thereby providing a digital equivalent of the analog input.

Figure 2:
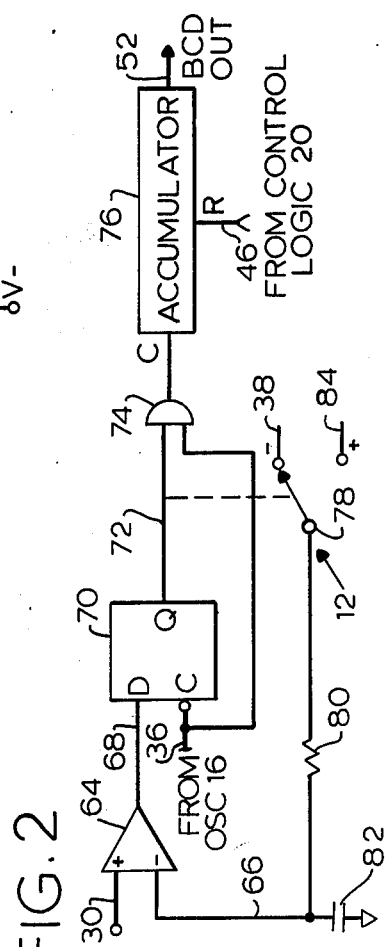
FIG. 2 is a simplified schematic diagram of the analog-to-digital converter shown in FIG. 1.

The amplified FIG. 2 schematic illustrates the circuit structure of the analog to digital converter 12 of the digital temperature measurement circuit 10. The input connection 30 from the temperature sensor 14 is connected to the plus input of a comparator 64. A negative input thereto is connected to a feedback line 66. An output 68 is connected to a D input of a D-type flip-flop 70, which has its clock input (C) connected to the clock oscillator 16 via the line 36. The non-inverting output (Q) line 72 of the flip-flop 70 is connected through an AND gate 74 to drive the clocking input to an accumulator 76 with a signal which is synchronous with the clock signal from the oscillator 16. The flip-flop output 72 also drives a solid state switch 78. In turn, the single pole double throw solid state switch 78 has its common pole connected to drive a resistor 80 and capacitor 82 network. Thus, the resistor 80 is connected by the switch 78 alternately to a negative reference voltage bus 38 from the bandgap voltage reference circuit 18 and a positive reference voltage bus 84, thereby charging and discharging the capacitor 82. The voltage at the capacitor 82 is applied through the feedback line 66 to the negative input of the comparator 64. The negative reference voltage on the bus 38 is the bandgap reference and the voltage on the bus 84 is effectively the ground reference potential. These potentials on the buses 38 and 84 are the normal boundary limits of the input signal at the input 30. In operation, a signal is generated at the pole of the switch 78 having a DC value equal to the analog input at the line 30. This generated signal is filtered by the low pass resistor 80 and capacitor 82 to regenerate the original signal at the minus comparator input. The error is continually sampled and pulses generated in order to keep the two inputs to the comparator 64 tracking.

By synchronizing the output signal on the line 72 from the flip-flop 70 to the clock signal, a linear relationship is obtained which is required to equate the DC value at the pole of the switch 78 with the total number of positive pulses on the line 72. A reset signal is applied to the accumulator via the line 46 from the control logic circuitry 30.

The conversion scale factor of the A to D converter 12 and its accuracy within practical circuit limits is determined by choosing the length of the accumulate (conversion) cycle which is defined as the total number of clock pulses occurring from the start to the finish of an accumulate (conversion) cycle.

The calibration of the A to D converter in terms of degrees Celsius or Fahrenheit is accomplished by adjustment of the length of the conversion cycle. The maximum count is set to be 20 times the extrapolated maximum temperature readings, i.e., the temperature where the extrapolated base to emitter voltage of sense transistors in the sensor 14 equals zero. After a division by two the value in the BCD accumulating counter is the temperature reading in tenths of degrees.

Referring again to FIG. 1, analog temperature information is supplied to the A to D converter 12 from the temperature sensor 14 which is formed of two parasitic NPN transistors at the substrate of chip 10. The two transistors 86 and 88 are formed by the N− P− N+ junctions available to the substrate in standard metal gate CMOS processes. Parasitic transistors, such as the transistors 86 and 88, have excellent characteristics including a beta in excess of 100. However, such transistors are limited to emitter follower configurations and the collectors of both transistors 86 and 88 are connected to the substrate voltage source 58. The base of the transistor 86 is also connected to the voltage supply 58. The base of the transistor 88 is connected to the emitter 92 of the transistor 86, and the emitter 94 of the transistor 88 is connected via the line 26 and the switch 28 to the A to D converter 12. The emitters 92 and 94 are connected to current sources 93 and 95 respectively to bias the transistors 86 and 88 to provide the desired $V_{BE}$ voltage drops from each base to emitter.

The two temperature sense transistors 16 and 18 are biased such that the sum of their base to emitter voltages equals the reference voltage provided by a bandgap voltage reference circuit 18 at zero degrees Celsius. With other minor temperature variables added, this creates a temperature coefficient greater than 4 millivolts per degree Celsius. If the temperature reading of the sensor 14 is below zero degrees Celsius, then an autopolarity circuit will select a negative reference voltage from the bandgap voltage reference circuit 18 as a comparative value in the analog to digital conversion process.

The external connection 32 enables an external sensor to be connected to the input of the A to D converter 12 for remote probe operation. The automatic switching network 28 detects the connection of an external sensor to the line 32 and automatically switches from the internal sensor 14 to the line 32 in that event.

The clock oscillator 16 in the circuit 10 provides stable clock pulses at a predetermined fixed rate to the analog to digital converter 12 and to the control logic 20 via a connection 96. The clock also supplies pulses to the bandgap voltage reference circuit 18 which is described in much greater detail hereinafter in connection with FIGS. 3 and 4.

Parallel and/or serial output from the circuit 10 is provided via the output line 54 from a data latch and buffer circuit 22 which receives the digital data from the A to D converter 12, and which also operates under the supervision and control of the control logic circuit 20. The control logic circuit 20 is connected to control operation of the A to D converter 12 and also the bandgap voltage reference circuit 18. External control signals are supplied to the control logic circuit 30 via a line 32.

The circuit 10 also includes the voltage regulator 24 which supplies analog voltages on the bus 58 and digital voltages on a bus 60, with the digital voltages being lower than the analog voltages so that the digital circuit consumes very low power while remaining reliable in operation. Voltage is supplied to the circuit 10 via the external lead 56 which is connected to the voltage regulator circuit 24. The CMOS digital circuitry of the circuit 10 is operated from a reduced supply voltage of about five volts so that special processing techniques such as channel stops are not required in the fabrication of the chip 10.

Figure 3:
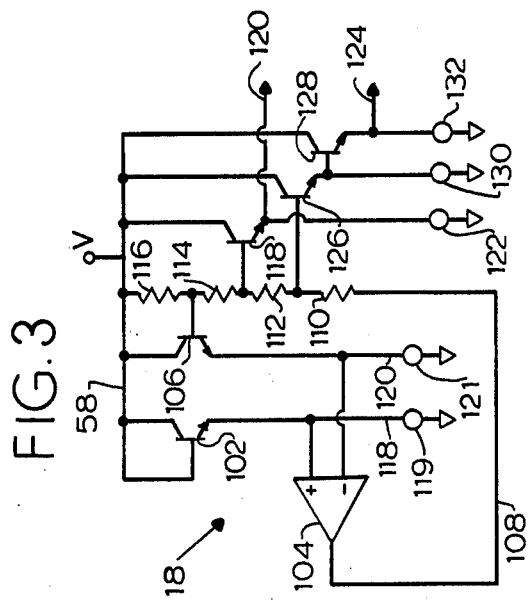
FIG. 3 is a summarized schematic diagram of the bandgap voltage reference circuit element of the circuitry shown in FIG. 1.

The bandgap voltage reference circuit 18 is shown in the functional schematic diagram of FIG. 3. The reference circuit 18 advantageously utilizes parasitic transistor elements of the type described in connection with the temperature sensor element 14. A first parasitic transistor 102 is formed from the chip substrate 58 as an emitter follower. The base and collector of the transistor 102 are both connected directly to the substrate voltage supply 58. The emitter of the transistor 102 is connected to the plus (+) input of a balancing amplifier 104 and to a current source 119. A second transistor 106 is formed from the substrate 58 as an emitter follower and has its collector tied directly to the supply 58. The emitter of the transistor 106 is connected to a minus (−) input of the amplifier 104 and to a current source 121. An output line 108 from the amplifier 104 is connected through a resistor 110, another resistor 112, a third resistor 114 and a fourth resistor 116 connected to the supply 58. A common node between the resistors 114 and 116 is connected directly to the base of the transistor 46.

With the circuitry shown in FIG. 3, the reference transistors 102 and 106 are biased with approximately 50 microamperes of current flow through their respective emitters 118 and 120. The balancing amplifier 104 functions to sense the emitter voltages of the transistor 102 and 106 and forces them to track together at equal potential by providing a differential output current through the resistors 50, 52 and 54 to the base of the transistor 106. The transistor 106 has a base-emitter junction area ten times larger than the transistor 102. This creates a smaller voltage drop across the base-emitter junction of the transistor 106 and thereby develops a voltage across the resistor 116 which is in turn amplified across the resistors 110, 112 and 114. This voltage has a positive temperature coefficient, and when it is properly scaled by resistors 114 and 116 and is added to the $V_{BE}$ of a third parasitic transistor 118, it develops the positive temperature voltage reference output 120 of about $-1.2$ V, with respect to the substrate voltage supply 58. The positive temperature voltage reference 120 is independent of temperature. The base emitter junction voltage $V_{BE}$ of the transistor 118 is added by connecting the base of the transistor 118 to the junction of the resistors 112 and 114. The collector of the transistor 118 is connected to the substrate 58 and the emitter thereof biased by a current source 122.

The negative temperature reference voltage output 124 is similarly generated by scaling the positive temperature coefficient voltage over one additional resistor 112 in addition to the resistors 114 and 116 and adding to the $V_{BE}$ of two additional parasitic transistors 126 and 128 which have their emitters connected to two current sources 130 and 132. The negative reference 124 is about $-2.4$ V relative to the substrate 58.

The balancing amplifier 104 must be provided with a very high gain and have very little temperature drift. Minor predictable drifts are acceptable as they may be eliminated in the analog to digital conversion cycle. The amplifier 104 has been found to have 0.2 millivolts offset change over a $-25$ to $+55$ degree Celsius temperature range with worse case devices. This small offset change is made possible because the amplifier 104 is optimized to work over a very small input voltage range. Noise rejection is enhanced and gain is increased by use of large geometry input transistors in the amplifier 104. Initial offsets must of course be trimmed out, and this is normally done at the nominal operating temperature with the use of a small external trim resistor (not shown). Alternatively, as is done in the present case, an auto zero cycle may be employed. Additional characteristics of the amplifier 104 include a gain of approximately 87 decibels, with a phase margin of 70° and an offset of 4 millivolts.

Figure 4:
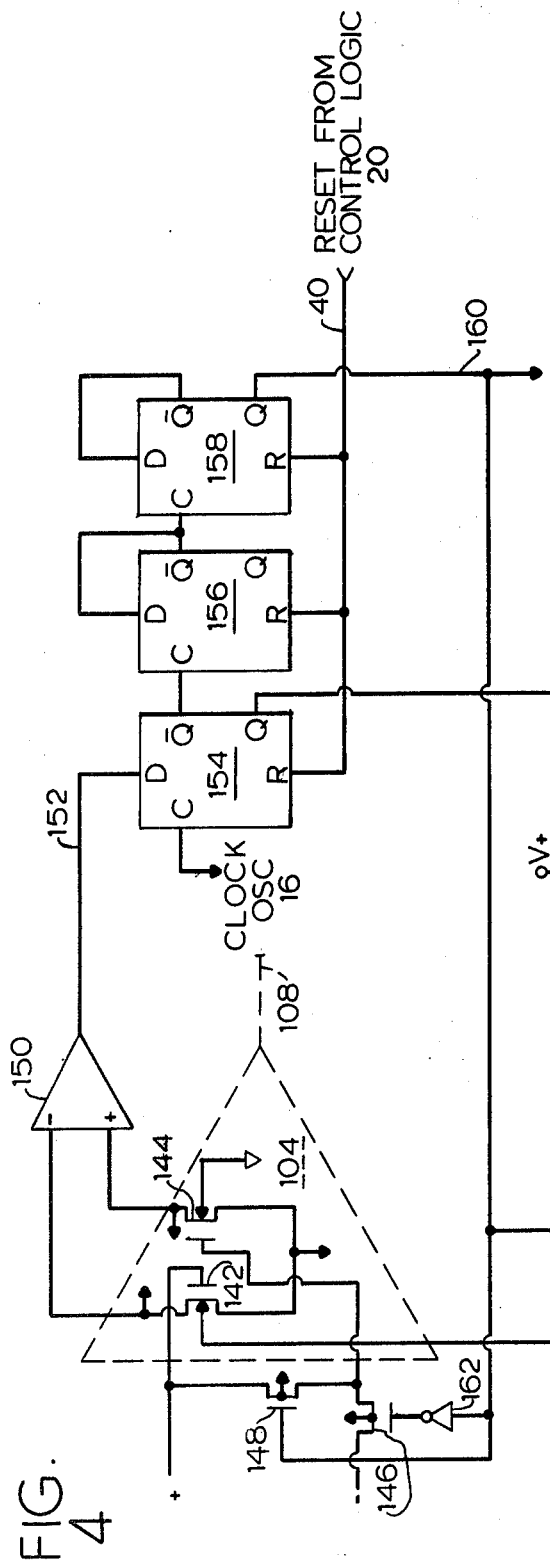
FIG. 4 is a more detailed schematic and logic symbol diagram of an automatic calibration circuit for the input of the balancing amplifier of the bandgap voltage reference circuit shown in FIG. 2.

An automatic calibration circuit 140 for automatically reducing the offset or null of the amplifier 104 is shown in FIG. 4. Therein, the operational amplifier 104 is shown diagrammatically by the dashed line triangle.

Two input N-channel MOS field effect transistors 142 and 144 are depicted schematically within the dashed triangle representing the amplifier 104. The output line 108 is shown, but other circuitry within the amplifier 104 is omitted.

The plus input connection to the amplifier 104 which is from the emitter of the transistor 102 (FIG. 3) is connected to the insulated gate of the transistor 142. The minus input to the amplifier 104 is connected to the insulated gate of the transistor 144 through the source to drain connection of a P-channel transistor gate 146 from the emitter of the parasitic transistor 106 (FIG. 3). The drain of the transistor 146 is also connected to the source of a second P-channel transistor gate 148 having a drain connection to the plus input of the amplifier 104. The function of the transistors 146 and 148 will be explained hereinbelow. The drain connections of the transistors 142 and 144 are supplied as minus and plus inputs, respectively, to a comparator 150 which functions to compare the voltages thereat and provides a logical output signal in the event of nonequivalence. An output line 152 is connected as a D input to an edge triggered D type flip-flop 154 which has a clock connection to the clock oscillator 16 (FIG. 1). The inverting output of the flip-flop 154 is connected to the clocking input of a second flip-flop 156 in which its D input and inverting output are connected together and to the clocking input of a third D type flip-flop 158, also having its inverting output connected to the D input. A non-inverting output line 160 from the third flip-flop 158 is connected directly to the insulated gate of the transistor 148 and is connected to the insulated gate of the transistor 146 through an inverting amplifier 162. A reset line 40 is connected from the control logic circuit 20 to the reset inputs of the flip-flops 154, 156 and 158. Flip-flops 156 and 158 are configured as binary counters.

The output line 160 of the second counter 158 is connected to the clock oscillator 16 and control logic 20 (FIG. 1), and is also connected to control an analog switch 166 (FIG. 4). A non-inverting output from the latch 154 is connected to the input gates of a CMOS array 168. The array 168 has an output node connected through a resistor 170 to the analog switch 166 and therethrough, when the switch is closed, to the capacitor 44 which is external to the chip 10. The capacitor 44 is connected to the P-substrate well of the input transistor 142.

Prior to an analog to digital conversion cycle to convert the temperature dependent voltage at the sensor 14 into a digital number, the bandgap reference circuit 18 is calibrated by nulling the reference amplifier 104. The auto-null cycle accomplished by the circuit 140 is not of fixed duration, but continues until a good balance is achieved at the input of the amplifier 104.

The auto-null cycle is started by a reset pulse from the control logic circuit 20 applied to the reset inputs of the three edge triggered D type flip-flops 154, 156 and 158. The output of the flip-flop 158 is reset to logical zero, and this turns on the analog switch 166. It also turns on the transistor 148 and, because of the inverter 162, turns off the transistor 146 and thereby disconnects the minus input of the amplifier 104 from the emitter of the parasitic transistor 106 of the reference circuit 18 (FIG. 3). The transistor 148 (FIG. 4) functions to short the two inputs of the amplifier 104 together. The plus input of the amplifier 104 serves as the reference input. Operation of the analog switch 166 by the output from the flip-flop 158 connects the external capacitor 44 through the resistor 170 to the CMOS complementary pair 168. This network adjusts the substrate voltage and thus the threshold of the input transistor 142. This substrate adjustment accomplished by the capacitor 44, resistor 170 and network 168 thereby controls the offset of the amplifier 104. The offset is sensed by operation of the comparator 150 which drives the D input of the latch 154 via the output line 152. As the capacitor 44 discharges past the null point, the output of the comparator 150 changes state and afterwards synchronously with the clock oscillator 16, the latch 154 changes state, thus quantizing the null adjustment. The offset will then be forced to oscillate around zero voltage or null point, synchronously with the period of the clock oscillator 16. After two oscillations, the second counter 158 will set, reconnecting the voltage reference circuit 18 for normal operation, by turning off the analog switch 166 and thereby leaving the error offset voltage stored in the capacitor 44, turning off the shunt transistor 148 and turning on the gate 146 which reconnects the minus input of the amplifier 104 to the second reference transistor 106. The two counts provided by the counters 156 and 158 eliminate the need for starting the nulling in a known correct direction, and reduce the possibility of noise triggering error.

The resulting net offset at the input of the amplifier 104 is the offset of the comparator 150 divided by the first stage amplification of the balance amplifier 104 plus the quantizing error determined by the clock frequency and circuit delays as compared to the time constant of the capacitor 44 and the resistor 170. With the circuitry shown in FIG. 4, offset reduction of a factor greater than 100 may be easily achieved.

Alternatively, the output of the amplifier 104 may be sensed and compared to a reference to null the entire amplifier 104 at its operating point.

It will be appreciated by those skilled in the art that the automatic nulling circuit 140 described in connection with FIG. 4 provides very high gain and accuracy with assured operating stability, with a simple, compact circuit having good noise immunity. A variable duration cycle provides a long time for initial zeroing upon power up conditions and very quick zeroing thereafter, combining high accuracy with good speed and complete isolation between input voltages and error offset voltage.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A single low power monolithic silicon chip integrated circuit for continuously sensing temperature phenomena and for providing a digital output corresponding to sensed temperature, said circuit including in electrical interconnection:

temperature sensor transistor means in said chip for providing an output voltage which varies with the temperature of said chip at the region of said sensor transistor means, bandgap voltage reference means in said chip for providing a known, stable reference voltage which is substantially independent of the temperature of said chip, analog to digital converter means in said chip for comparing said output voltage and said reference voltage and deriving from the comparison thereof said digital output corresponding to said sensed temperature.

2. The monolithic integrated circuit set forth in claim 1 formed in a standard CMOS chip fabrication process.

3. The monolithic integrated circuit set forth in claim 2 formed in a standard metal gate CMOS chip fabrication process.

4. The monolithic integrated circuit set forth in claim 3 wherein said temperature sensor transistor means includes a parasitic NPN transistor from the substrate of said chip, said transistor configured as an emitter follower.

5. The monolithic integrated circuit set forth in claim 3 wherein said temperature sensor transistor means comprises a first parasitic NPN transistor having its base and collector connected together to a power supply and its emitter biased by a current source on said chip and connected to the base of a second parasitic NPN transistor, said second transistor having its collector connected to said power supply and its emitter biased by a current source on said chip, an output voltage which varies in proportion with the temperature of said substrate being provided at the emitter of said second transistor.

6. The monolithic integrated circuit set forth in claim 1 wherein said bandgap voltage reference means comprises:
first transistor means formed as an emitter follower from the substrate of said chip, with a collector and a base both connected directly to a power supply,
second transistor means formed as an emitter follower from the substrate of said chip with a collector connected directly to the power supply and a base connected to the power supply through a resistance element,
balancing amplifier means having one input connected to the emitter of said first transistor means and another input connected to the emitter of said second transistor means, and having an output connected to the base of said second transistor means, said amplifier means for maintaining substantially identical emitter voltages on said first and second transistor means,
positive temperature coefficient voltage being provided at the base of said second transistor means amplified across a resistor and added to a third transistor means base emitter junction voltage to provide a stable reference voltage.

7. The monolithic integrated circuit set forth in claim 3 wherein said bandgap voltage reference circuit includes:
a first resistance element and a second resistance element in series therewith, and a power supply first parasitic NPN transistor means formed as an emitter follower from said substrate, with a collector and a base both connected directly to said power supply,
second parasitic NPN transistor means formed as an emitter follower from said substrate with a collector connected directly to said power supply, and a base connected to said power supply through said first resistance element,
high gain low drift-with-temperature-change balancing amplifier means having one input connected to the emitter of said first transistor means and another input connected to the emitter of said second transistor means, and having an output connected to the base of said second transistor means through said second resistance element, said amplifier means for balancing emitter voltages on said first and second transistor means,
third parasitic NPN transistor means formed as an emitter follower from said substrate, with a collector connected directly to said power supply and a base connected to said second resistance element,
a reference voltage output being provided at the emitter of said third transistor means substantially independent of temperature changes of said monolithic integrated circuit.

8. The monolithic integrated circuit set forth in claim 7 further comprising a third resistance element in series with said second element and said output of said balancing amplifier means, fourth and fifth parasitic transistor means formed as emitter followers from said substrate with collectors thereof being connected directly to said power supply, a collector of said fourth transistor means being connected directly to said power supply, a base of said fourth transistor means being connected to said third resistance element, and a base of said fifth transistor means being connected to the emitter of said fourth transistor means;
a second reference voltage output being provided at the emitter of said fifth transistor means.

9. The monolithic integrated circuit set forth in claim 6 further comprising automatic null reduction circuit means connected to the input of said balancing amplifier means for substantially reducing the null at the input of said balancing amplifier means during automatic calibration thereof, said null circuit comprising:
input floating and bridging means connected to the inputs of said balancing amplifier means for temporarily disconnecting one of said inputs and connecting said one to the other,
voltage charging network means connected to the substrate of said input transistor for adjusting the substrate voltage during a charging cycle and thereby the threshold voltage of input transistors in said balancing amplifier means,
comparator means connected to said input transistors in said balancing amplifier for sensing when charging network causes said input transistors to reach the null point of said balancing amplifier means and thereupon to change output state,
control means connected to said comparator means, to said charging network means and to said input floating and bridging amplifier means for stopping charging of said charging network when said comparator means changes state and for disconnecting said input floating and bridging means after a predetermined period thereafter.

10. A bandgap voltage reference circuit formed in a metal gate CMOS integrated circuit chip having a substrate, and a power supply in connection therewith, said chip comprising:
a first resistance element connected to said power supply and a second resistance element in series with said first resistance element,
first parasitic NPN transistor means formed as an emitter follower from said substrate, with a collector and a base both connected directly to said power supply.
second parasitic NPN transistor means formed as an emitter follower from said substrate with a collector connected directly to said power supply, and a base connected to said power supply through said first resistance element, high gain, low-drift-with-temperature-change balancing amplifier means in said chip having one input connected to the emitter of said first transistor means, and another input connected to the emitter of said second transistor means, and having an output connected to the base of said second transistor means through said second resistance element, said amplifier means for providing a correcting voltage at said output thereof in accordance with a difference between the voltages at the emitters of said first and second transistor means, third parasitic NPN transistor means formed as an emitter follower from said substrate, with a collector connected directly to said power supply and a base connected to said second resistance element, a reference voltage output being provided at the emitter of said third transistor means substantially independent of temperature changes of said monolithic integrated circuit.

11. The metal gate CMOS integrated circuit chip set forth in claim 10 further comprising:

temperature sensor transistor means for providing an output voltage which varies with the temperature of said chip at the region of said sensor transistor means, analog of digital converter means in said chip for comparing said output voltage with said reference voltage of said bandgap voltage reference circuit and deriving from the comparison thereof a digital output corresponding to said sensed temperature whereby said integrated circuit chip comprises a digital temperature sensor.

12. The metal gate CMOS integrated circuit chip set forth in claim 11 wherein said temperature sensor transistor means includes a parasitic NPN transistor from the substrate of said chip, said transistor configured as an emitter follower.

13. The metal gate CMOS integrated circuit chip set forth in claim 11 wherein said temperature sensor transistor means comprises a first parasitic NPN transistor having its base and collector connected together to a power supply and its emitter biased by a current source on said ship and connected to the base of a second parasitic NPN transistor, said second transistor having its collector connected to said power supply and its emitter biased by a current source on said chip, an output voltage which varies in proportion with the temperature of said substrate being provided at the emitter of said second transistor.

14. The metal gate CMOS integrated circuit chip set forth in claim 10 further comprising a third resistance element in series with said second element and said output of said balancing amplifier means, fourth and fifth parasitic transistor means formed as emitter followers from said substrate with collectors thereof being connected directly to said power supply, a collector of said fourth transistor means being connected directly to said power supply, a base of said fourth transistor means being connected to said third resistance element, and a base of said fifth transistor means being connected to the emitter of said fourth transistor means;

a second reference voltage output being provided at the emitter of said fifth transistor means.

15. The metal gate CMOS integrated circuit chip set forth in claim 10 further comprising automatic null reduction circuit means connected to the input of said balancing amplifier means for substantially reducing the null at the input of said balancing amplifier means during automatic calibration thereof, said null circuit comprising:

input floating and bridging means connected to the inputs of said balancing amplifier means for temporarily disconnecting one of said inputs and connecting said one to the other, voltage charging network means connected to the substrate of said input transistor for adjusting the substrate voltage during a charging cycle and thereby the threshold voltage of input transistors in said balancing amplifier means, comparator means connected to said input transistors in said balancing amplifier for sensing when charging network causes said input transistors to reach the null point of said balancing amplifier means and thereupon to change output state, control means connected to said comparator means, to said charging network means and to said input floating and bridging amplifier means for stopping charging of said charging network when said comparator means changes state and for disconnecting said input floating and bridging means after a predetermined period thereafter.

* * * * *